United States Patent
Farber et al.

(10) Patent No.: US 9,881,795 B2
(45) Date of Patent: *Jan. 30, 2018

(54) METHOD OF FABRICATING SEMICONDUCTORS

(71) Applicant: Texas Instruments Incorporated, Dallas, TX (US)

(72) Inventors: David Gerald Farber, Plano, TX (US); Ping Jiang, Plano, TX (US); Brian K. Kirkpatrick, Allen, TX (US); Douglas T. Grider, III, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/287,889

(22) Filed: Oct. 7, 2016

(65) Prior Publication Data
US 2017/0148634 A1    May 25, 2017

Related U.S. Application Data

(62) Division of application No. 14/952,693, filed on Nov. 25, 2015, now Pat. No. 9,490,143.

(51) Int. Cl.
| | |
|---|---|
| H01L 21/3205 | (2006.01) |
| H01L 21/28 | (2006.01) |
| H01L 21/3213 | (2006.01) |
| H01L 21/311 | (2006.01) |
| H01L 21/321 | (2006.01) |
| H01L 21/8234 | (2006.01) |

(52) U.S. Cl.
CPC .. *H01L 21/28123* (2013.01); *H01L 21/31116* (2013.01); *H01L 21/3212* (2013.01); *H01L 21/32136* (2013.01); *H01L 21/823456* (2013.01); *H01L 21/823462* (2013.01)

(58) Field of Classification Search
CPC .... H01L 21/3212–21/32125; H01L 21/02112; H01L 21/32051; H01L 21/32055; H01L 21/32137; H01L 21/28123; H01L 21/31116; H01L 21/32136; H01L 21/823456; H01L 21/823462; H01L 21/32131–21/32132; H01L 21/31111–21/31122; H01L 21/32133–21/32139
USPC ................................ 438/589, 638, 672, 675
See application file for complete search history.

(56) References Cited

U.S. PATENT DOCUMENTS

| | | | |
|---|---|---|---|
| 6,271,593 B1 * | 8/2001 | Givens | H01L 21/76838 257/637 |
| 6,831,005 B1 | 12/2004 | Ross | |

(Continued)

*Primary Examiner* — Kevin M Picardat
(74) *Attorney, Agent, or Firm* — Jacqueline J. Garner; Charles A. Brill; Frank D. Cimino

(57) ABSTRACT

A method of manufacturing a semiconductor includes applying a planarization material to a substrate and forming an opening in the planarization material. The opening is filled with polysilicon. A plurality of etching modulation sequences are applied to the substrate, each of the etching modulation sequences including: applying a first etching process to the substrate, wherein the first etching process is more selective to polysilicon than the planarization material; and applying a second etching process to the substrate, wherein the second etching process is more selective to the planarization material than the polysilicon.

15 Claims, 4 Drawing Sheets

(56) References Cited

U.S. PATENT DOCUMENTS

| | | |
|---|---|---|
| 6,960,818 B1 | 11/2005 | Rengarajan et al. |
| 9,490,143 B1 * | 11/2016 | Farber ................. H01L 21/3212 |
| 2002/0084257 A1 | 7/2002 | Bjorkman et al. |
| 2002/0135025 A1 | 9/2002 | Park |
| 2006/0040462 A1 | 2/2006 | Wu et al. |
| 2006/0110935 A1 * | 5/2006 | Miyake ............. H01L 21/76829 438/778 |
| 2010/0025685 A1 * | 2/2010 | Shiraishi ........... H01L 21/76814 257/52 |
| 2016/0005669 A1 | 1/2016 | Yu et al. |
| 2016/0240429 A1 * | 8/2016 | Engelhardt ....... H01L 21/76227 |

* cited by examiner

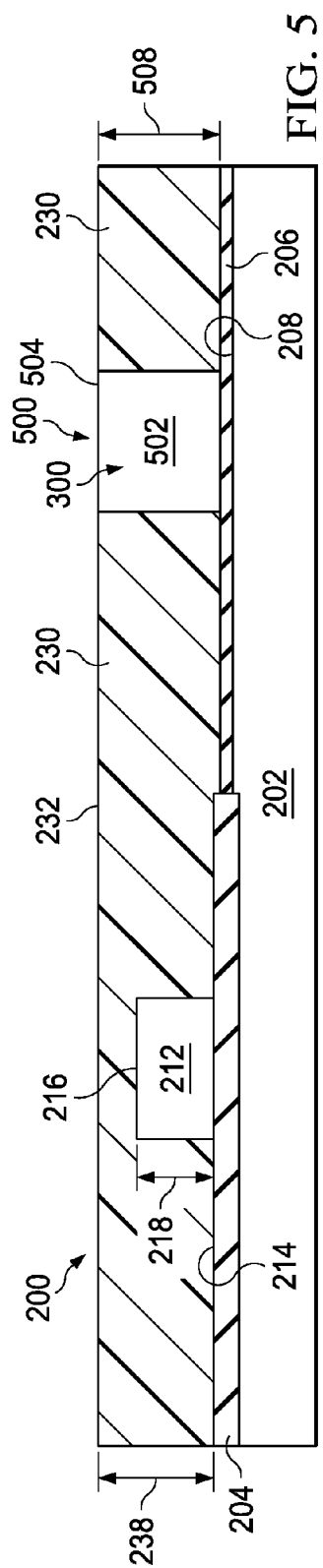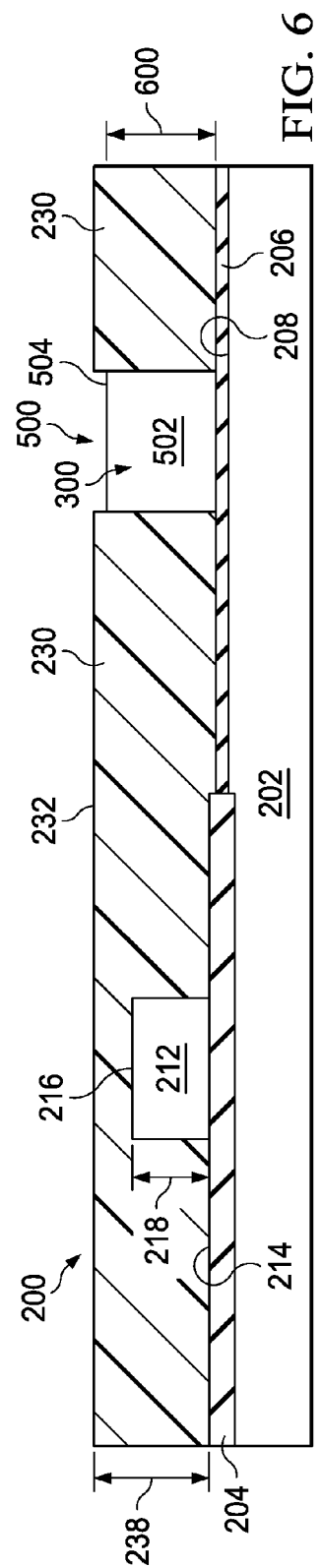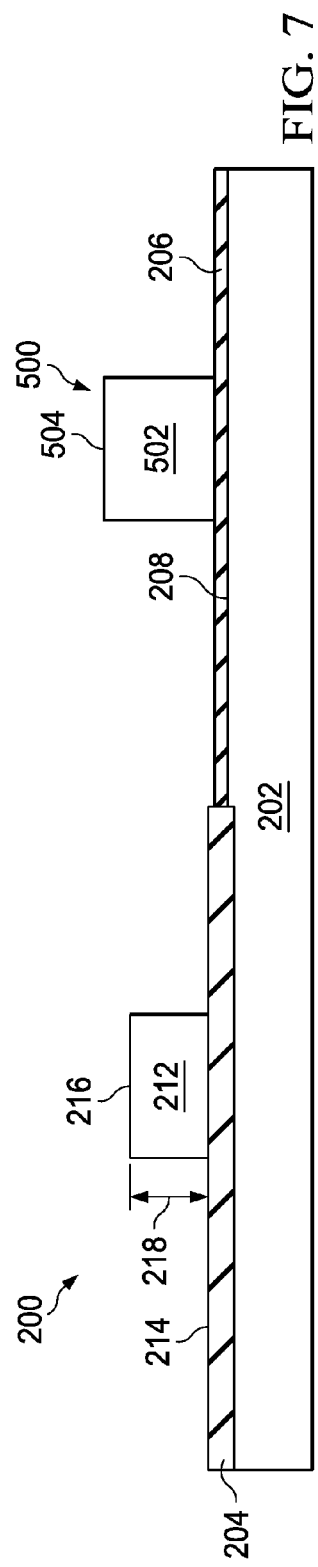

METHOD OF FABRICATING SEMICONDUCTORS

CROSS REFERENCE TO RELATED APPLICATIONS

This application is a continuation of U.S. Nonprovisional patent application Ser. No. 14/952,693 filed Nov. 25, 2015, the contents of which are herein incorporated by reference in its entirety.

BACKGROUND

The fabrication of some semiconductors involves fabricating a plurality of different electronic components on a substrate, such as a wafer. Due to processing requirements or the use of different materials in the electronic components, the components may have to be fabricated at different times. For example, a semiconductor may require two different types of transistors wherein each type of transistor has a gate electrode consisting of different materials. The fabrication of a second gate electrode for a second transistor may adversely affect a first gate electrode, which is fabricated at an earlier time during the fabrication process. In other words, because the second gate electrode is fabricated after the first gate electrode, the fabrication of the second gate electrode may adversely affect or damage the first gate electrode.

During the fabrication of some transistors on a substrate, a first transistor gate electrode is fabricated with several different layers and materials. A second transistor gate electrode is subsequently fabricated from at least one material, such as polysilicon. A planarization material is distributed over the substrate to protect the first gate electrode during fabrication of the second gate electrode. The planarization material is etched in the location of the second gate electrode to form an opening. The material of the second gate electrode, including the polysilicon, is applied to the substrate so that it fills the opening and forms the second gate electrode.

The height of the second gate electrode may need to be adjusted. To adjust this height, an etching process is applied to the substrate. For example, a plasma etchback process may be applied to reduce or etch the second gate electrode to a predetermined height. Performing a plasma etchback on the substrate creates a defect, such as a crown defect, on the edge of the second gate electrode proximate the planarization material. The crown defect hinders the application of subsequent materials onto the surface of the second gate electrode. Present techniques to remove the crown defect damage other materials and components on the substrate. For example, chemicals applied to the substrate to remove the crown defects may damage other materials that are exposed to the chemicals. Therefore, a need exists for a semiconductor fabrication technique that does not produce crown defects.

SUMMARY

A method of manufacturing a semiconductor includes applying a planarization material to a substrate and forming an opening in the planarization material. The opening is filled with polysilicon. A plurality of etching modulation sequences are applied to the substrate, each of the etching modulation sequences including: applying a first etching process to the substrate, wherein the first etching process is more selective to polysilicon than the planarization material; and applying a second etching process to the substrate, wherein the second etching process is more selective to the planarization material than the polysilicon.

BRIEF DESCRIPTION OF THE DRAWINGS

FIG. 5 is a side cutaway view of the semiconductor of FIG. 4 after planarization of the second gate material.

FIG. 6 is a side elevation view of the semiconductor of FIG. 5 after the height of the second gate was reduced.

FIG. 7 is a side elevation view of the semiconductor of FIG. 6 after removal of the planarization material.

DETAILED DESCRIPTION

During the fabrication of some semiconductors, gates and other devices are fabricated onto a substrate, such as a wafer. A semiconductor includes devices and circuits fabricated on a semiconductor material. The fabrication processes can involve multiple steps and several different types of devices being fabricated onto the substrate. For example, different types of transistor gate electrodes may need to be fabricated, wherein the different gate electrodes are fabricated from different materials under different conditions and at different times during the fabrication processes.

The fabrication of one device may damage another device that has been previously fabricated. In order to prevent damage to the previously fabricated device, a planarization material is placed over a first fabricated device to protect it during the fabrication of a second device or a plurality of devices. In some embodiments, the second device is a polysilicon device such as a polysilicon gate electrode and the planarization material is an organic planarization material. During an etchback process of the polysilicon, a crown defect forms proximate the junction of the planarization material and the polysilicon. The processes described herein prevent or reduce these crown defects.

Figure 1:
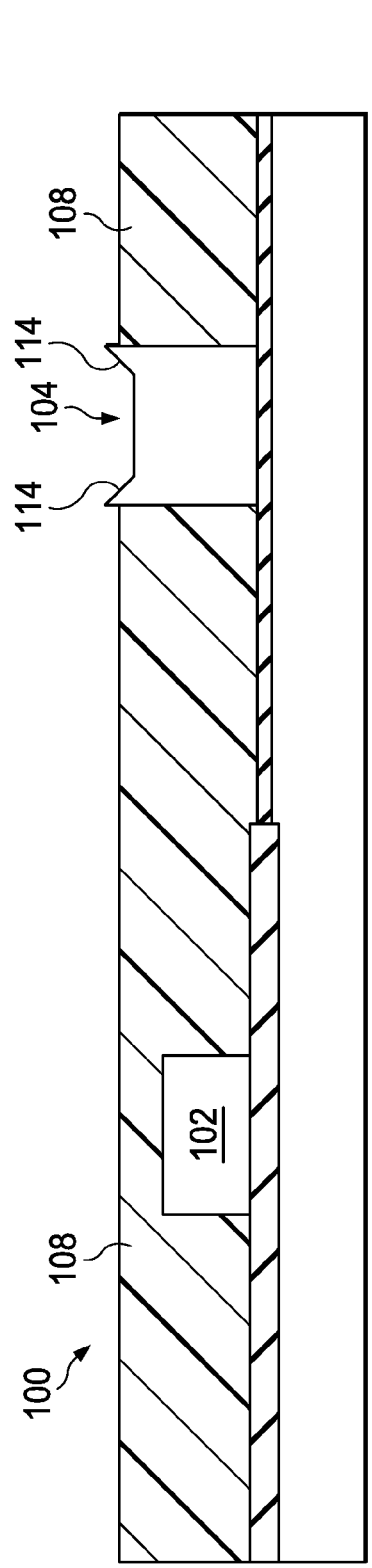
FIG. 1 is a side cutaway view of a semiconductor with a crown defect located on a gate.

FIG. 1 is a side cutaway view of an example semiconductor 100 that has undergone conventional etching. The semiconductor 100 includes a first gate electrode 102 and a second gate electrode 104, which are sometimes referred to herein as the gate 102 and the gate 104, respectively. A planarization material 108 covers and protects the first gate 102 during fabrication of the second gate 104. At the point of processing in FIG. 1, the second gate 104 has been etched to lower its height and a crown defect 114 remains on the second gate 104 after the etching. The crown defect 114 is a peak or ridge on the surface of the polysilicon of the second gate 104 that impairs the fabrication of other materials onto the second gate 104. Conventional chemicals and processes may partially remove the crown defect 114, but they may also damage other components on the semiconductor 100. The fabrication methods described herein repeatedly modulate between a first etching process and a second etching process, which does not leave a crown defect.

Figure 2:
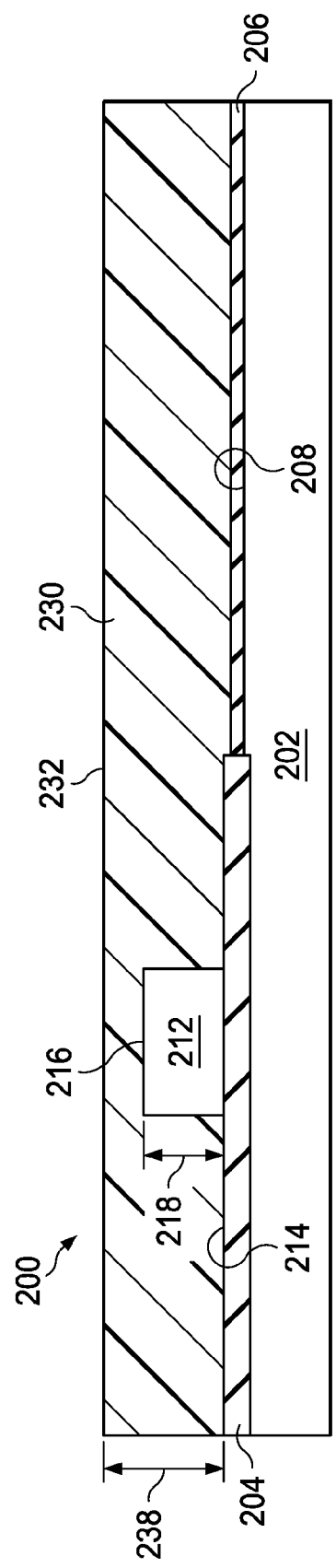
FIG. 2 is a side cutaway view of an example of a semiconductor during the fabrication process, wherein the semiconductor has a first gate formed thereon, and wherein the first gate is covered by a planarization material.

FIG. 2 is a side cutaway view of a semiconductor 200 in the process of fabrication. At this stage of fabrication, the semiconductor 200 has a substrate 202, such as a silicon substrate with a first dielectric material 204 and a second dielectric material 206 fabricated onto a surface 208 of the substrate 202. The processes of applying materials to fabricate the semiconductor 200 are referred to as being applied to the substrate 202 irrespective of the where the materials are applied. In the example of FIG. 2, the first and second dielectric materials 204 and 206 have different thicknesses. For example, the first and second dielectric materials 204 and 206 may support different devices, such as different transistor gate electrodes that operate at different voltages. The thicker first dielectric material 204 enables devices fabricated thereon to operate at higher operating voltages than devices fabricated on the thinner second dielectric material 206 when both dielectric materials 204 and 206 are the same material. Examples of the dielectric materials 204 and 206 include silicon dioxide ($SiO_2$), silicon oxynitride (SiON), high temperature oxide (HTO), hafnium dioxide ($HfO_2$), ruthenium (IV) oxide ($RuO_2$), hafnium silicon oxynitride (HfSiOxNy), zirconium dioxide (ZrO2), zirconium silicon dioxide (ZrSiO2), and zirconium silicon oxynitride (ZrSiOxNy). The dielectric materials 204 and 206 are examples of different dielectric materials and/or thicknesses. Other semiconductor constructions may not have dielectric materials in the locations of the dielectric materials 204 and 206.

A first gate electrode 212, referred to herein as the first gate 212, is fabricated onto a surface 214 of the first dielectric material 204. The first gate 212 is shown as a single block; however it may have several layers and may be fabricated from a plurality of different materials as known in the art. The first gate 212 has an upper surface 216 that is located a height 218 above the surface 214 of the first dielectric material 204. Examples of the materials of the first gate 212 include polysilicon and a variety of metals including tungsten, titanium nitride (TiN), tungsten silicide (WSix), and other materials.

At this stage of fabrication, a second gate electrode (not shown in FIG. 2) is to be fabricated onto the substrate 202. The fabrication processes for the second gate can damage the first gate 212, so the substrate 202, including the first and second dielectric materials 204 and 206 and the first gate 212, are covered with a planarization material 230, which in the examples described herein is an organic planarization material. The planarization material 230 has a top surface 232 and extends to a height 238 above the first dielectric material 204. The top surface 232 may be substantially smooth, irrespective of the different thicknesses of the first dielectric material 204 and the second dielectric material 206. The planarization material 230 covers the upper surface 216 of the first gate 212. Examples of the planarization material 230 include spin-on-glass (SOG), other dielectrics, and an organic bottom anti-reflective coating (BARC).

Figure 3:
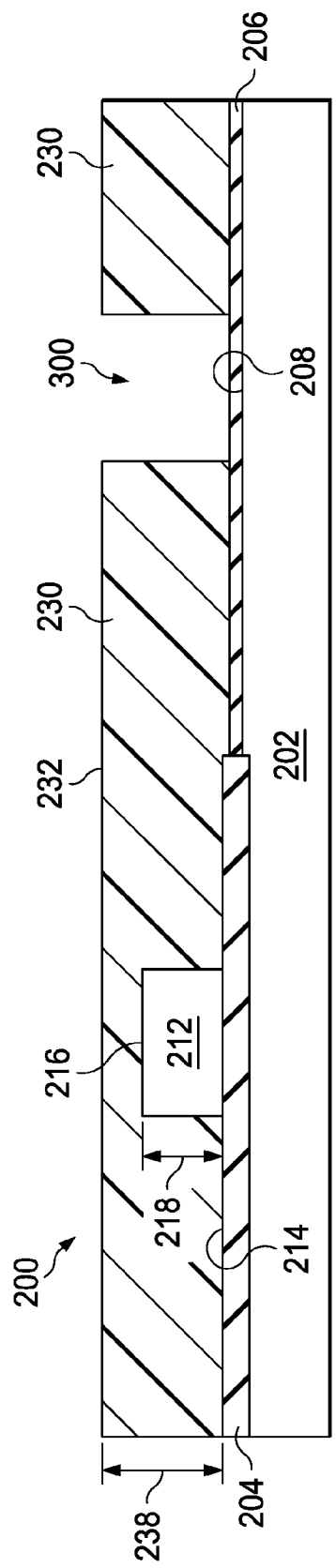
FIG. 3 is a side cutaway view of the semiconductor of FIG. 2 with a portion of the planarization material removed for the fabrication of a second gate.

FIG. 3 is a side elevation view of the semiconductor 200 of FIG. 2 with a portion of the planarization material 230 removed for the fabrication of the second gate. An etched portion 300 of the planarization material 230 has been removed as shown in FIG. 3. The process for removing the etched portion 300 may be performed by conventional etching or other techniques, such as photolithography pattern and plasma etch processes, based on the type of the planarization material 230 applied to the substrate 202. For example, a mask (not shown) or the like may be deposited onto the surface 232 of the planarization material 230 to limit the etching to the etched portion 300 of the planarization material 230. The etching material and/or etching process is applied to the substrate 202 so that only the etched portion 300 is removed from the planarization material 230. In the example of FIG. 3, the etched portion 300 extends to the second dielectric material 206 and will be filled with at least one material to fabricate the second gate as described further below.

Figure 4:
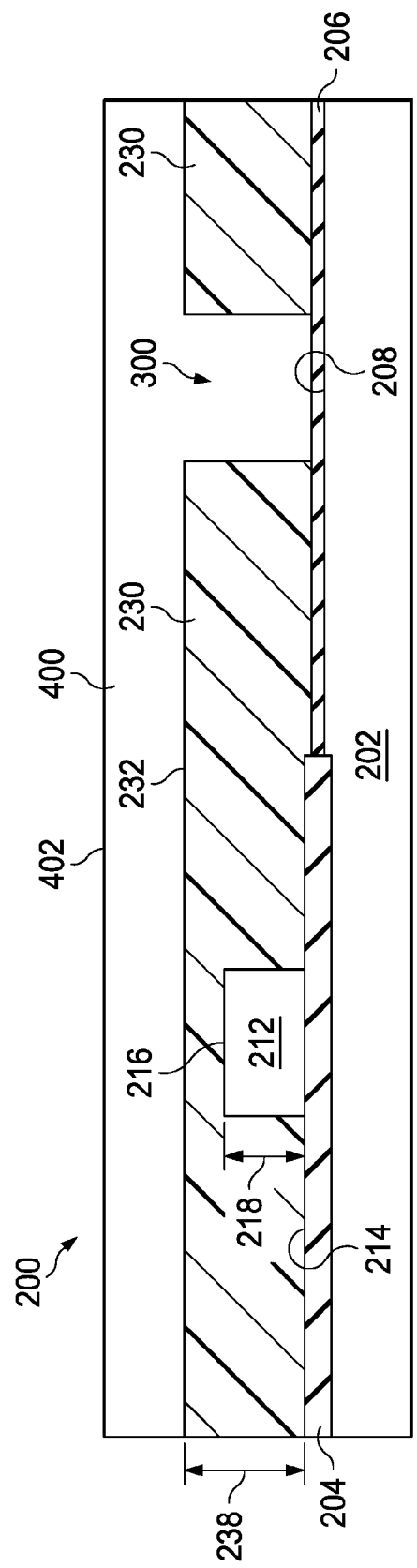
FIG. 4 is a side cutaway view of the semiconductor of FIG. 3 after the application of a gate material.

FIG. 4 is a side cutaway view of the semiconductor 200 of FIG. 3 after application of a second gate material 400. In the embodiments described herein, the second gate material 400 is a material commonly used for gate fabrication, such as polysilicon or other gate electrode material. The second gate material 400 fills the etched portion 300 down to the second dielectric material 206 and has a top surface 402. The second gate material 400 may be deposited by conventional methods.

FIG. 5 is a side cutaway view of the semiconductor 200 of FIG. 4 after planarization of the second gate material 400. Planarization can be achieved by plasma etchback or chemical mechanical polishing (CMP). After planarization, a second gate electrode 500, which is referred to as the second gate 500 is formed in the etched portion 300 of the planarization material 230. The second gate 500 is formed of gate material 502, which is the gate material 400 of FIG. 4 that remains in the etched portion 300 after planarization. The gate material 502 has a top surface 504 that is located a height 508 above the second dielectric material 206. In the example of FIG. 5, the surface 504 is substantially even with the surface 232 of the planarization material 230. The height 508 of the gate material 502 may have to be lowered, which is achieved by an etchback process wherein different etching processes are repeatedly modulated on the substrate 202 to prevent the formation of a crown defect.

In one example, the gate material 400 is removed using gas modulation. In other examples, the gate material is removed using modulations of power and/or pressure that may include the gas modulation. As described herein, the removal of the gate material 400, disclosed herein does not form a crown defect or the crown defect is negligible. Modulated etching processes are repeatedly applied to the substrate 202 to prevent the formation of a crown defect on the second gate 500. More specifically, the gas modulation process is applied to the gate material 400/502 and the planarization material 230 when the gate material 400/502 is removed along with the planarization material 230. An example of the modulation process repeatedly toggles between a more selective polysilicon etch and a more selective organic planarization material etch, wherein the toggling may occur when the top surface 504 of the gate material 502 has been etched or otherwise removed to be in close proximity to the surface 232 of the planarization material 230. The polysilicon selective etching process etches the second gate material 400 and 502 faster than the planarization material 230. An example of an etching chemistry includes at least one of hydrogen bromide (HBr) and chlorine gas ($Cl_2$). In some examples, the etching chemistry includes a combination of HBr and $Cl_2$.

The organic material selective etching process etches the planarization material 230 faster than the second gate material 400/502. Examples of the etch chemistry include an oxidizer, such as oxygen, carbon monoxide, carbon dioxide, and other oxidizers. During a first portion of the modulation, the second gate materials 400 and 502 are etched primarily and during a second portion of the modulation, the planarization material 230 is etched primarily. The application of the etching processes are toggled repeatedly a plurality of times depending on factors, such as the types of etching materials and/or etching chemistry and the type of planarization material 230 and material of the second gate materials 400 and 502. By controlling the process and duration of each etch step in the modulation, the amount of etching of both the second gate materials 400 and 502 and the planarization material 230 can be controlled so that they etch to predetermined depths without creating crown defects.

As described above, each cycle or sequence of the etching modulation process may only etch a small portion of material. Etching consists of toggling between different etching processes for a plurality of cycles until the second gate material 400/502 is removed to achieve the height 508. By balancing the etching strengths and the modulation times of the etching processes, both the planarization material 230 and the second gate material 400/502 may be etched at predetermined rates.

FIG. 6 is a side elevation view of the semiconductor 200 after the height of the second gate 500 has been reduced to a height 600. After the gate height 508 of FIG. 5 has been achieved, the etching process may continue to lower the height of the gate 500 to the height 600 as shown in FIG. 6. When the second gate material 502 has been removed below or equal to the planarization material 230, the etching process may change, as a design choice, to focus on reducing the height of the second gate 500. For example, the modulation times may change to reduce the height of the second gate 500 when the gate material 400 shown in FIG. 4 has been removed.

FIG. 7 is a side elevation view of the semiconductor 200 of FIG. 6 after removal of the planarization material 230. The semiconductor 200 has the first gate 212 and the second gate 500 exposed and at predetermined heights. The second gate 500 was fabricated after the first gate 216 and without damaging the first gate 216. In addition, no crown defect is present on or about the second gate 500.

In some examples, the planarization material 230 is removed using a conventional chemical mechanical polishing (CMP). In such examples, the second gate material 502 is at the height of the planarization material 230 after CMP. In order to achieve the correct height of the second gate 500, plasma etching is required to be performed. Because the gate material 502 of the second gate 500 and the planarization material 230 are adjacent each other, the plasma etching causes the crown defect as described above.

With additional reference to FIG. 4, the gate material 400 may be removed to the height of the planarization material 230 by application of CMP. In this process, the surface 504 of the second gate 500 is typically at the same height as the surface 232 of the planarization material 230. In some electronic devices, the height 508 of the second gate 500 has to be lower than the height 218 of the first gate 212. Etching is performed on the substrate 202 using the modulated etching processes described above to etch the second gate 500 to a predetermined height 508. As described above, the etching using the modulated processes does not leave a crown defect or the crown defect is negligible.

Figure 8:
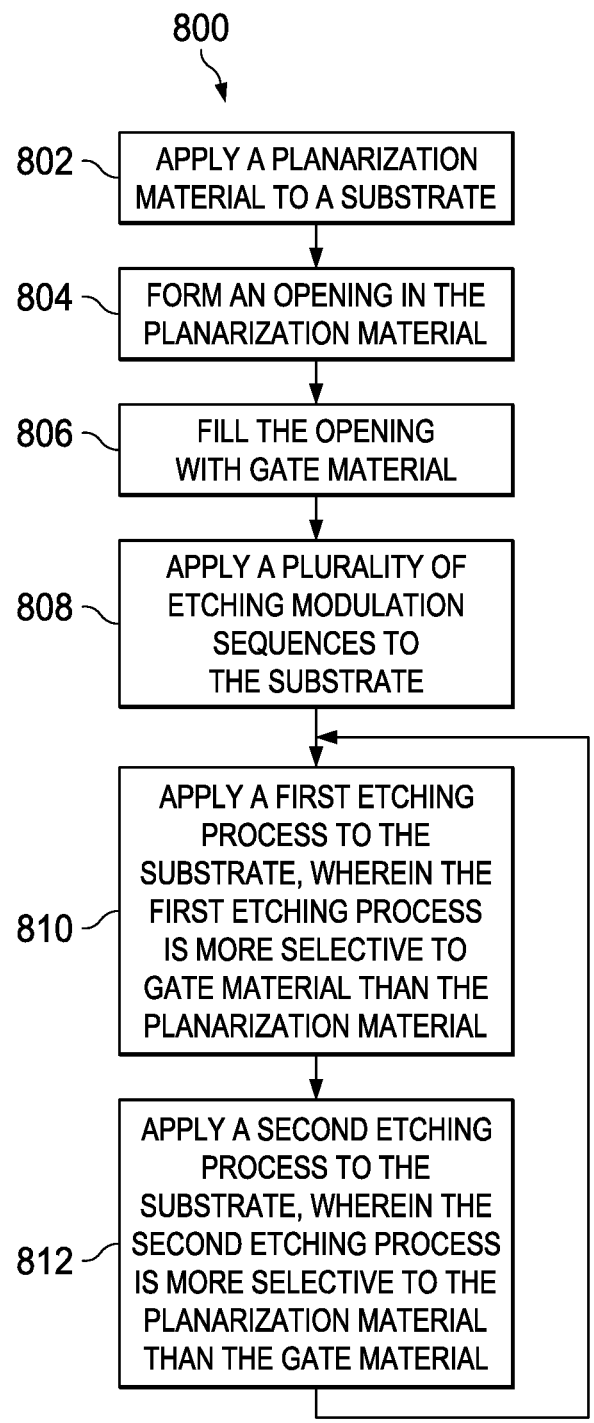
FIG. 8 is an example flowchart describing a process wherein etching materials are modulated onto the semiconductor of FIG. 4 to yield the semiconductor of FIG. 5.

The etchback processes described above are further described by the flow chart 800 of FIG. 8. At step 802 a planarization material is applied to a substrate. At step 804, an opening is formed in the planarization material. At step 806 the opening is filled with a gate material. A plurality of etching modulation sequences are applied to the substrate at step 808. A step of the modulation sequence includes applying a first etching process to the substrate, wherein the first etching process is more selective to the gate material than the organic planarization material as shown in step 810. A second step of the modulation sequence includes applying a second etching process to the substrate, wherein the second etching process is more selective to the organic planarization material than the gate material as shown in step 812.

While some examples of wafer fabrication have been described in detail herein, it is to be understood that the inventive concepts may be otherwise variously embodied and employed and that the appended claims are intended to be construed to include such variations except insofar as limited by the prior art.

What is claimed is:

1. A method of making a semiconductor device, the method comprising:
    forming a first gate over a substrate;
    applying a planarization material to the substrate over the first gate;
    forming an opening in the planarization material for a second gate;
    filling the opening with polysilicon; and
    applying a plurality of etching modulation sequences to the substrate to form the second gate from the polysilicon, each of the etching modulation sequences comprising:
        applying a first etching process to the substrate, wherein the first etching process is more selective to polysilicon than the planarization material; and
        applying a second etching process to the substrate, wherein the second etching process is more selective to the planarization material than the polysilicon.

2. The method of claim 1, wherein applying a plurality etching modulation sequences to the substrate includes applying a plurality of plasma etching modulation sequences to the substrate.

3. The method of claim 1, wherein the first etching process includes a first plasma etching gas and the second etching process includes a second, different, plasma etching gas.

4. The method of claim 1, wherein the first etching process includes a first plasma etching pressure and the second etching process includes a second, different, plasma etching pressure.

5. The method of claim 1, wherein the first etching process includes a first plasma etching power and the second etching process includes a second, different, plasma etching power.

6. The method of claim 1, wherein applying a first etching process includes applying a gas chemistry having at least one of hydrogen bromide and chlorine.

7. The method of claim 1, wherein applying a second etching process includes applying a gas chemistry having at least one of oxygen, carbon monoxide, and carbon dioxide.

8. The method of claim 1, wherein applying a planarization material to a substrate comprises applying an organic planarization material to a substrate.

9. A method of making a semiconductor having devices and circuits, the method comprising:
    forming a first gate over a substrate;
    applying a planarization material to the substrate over the first gate;
    forming an opening in the planarization material;
    filling the opening with a gate electrode material;
    applying a CMP process to render the gate electrode material and the planarization material to the same height; and applying a plurality of plasma etching modulation sequences to the substrate, each of the etching modulation sequences comprising:
  applying a first etching process to the substrate, wherein the first etching process is more selective to the gate electrode material than the planarization material; and
  applying a second etching process to the substrate, wherein the second etching process is more selective to the planarization material than the gate electrode material.

10. The method of claim 9, wherein the first etching process includes a first plasma etching gas and the second etching process includes a second, different, plasma etching gas.

11. The method of claim 9, wherein the first etching process includes a first plasma etching pressure and the second etching process includes a second, different, plasma etching pressure applied to the substrate.

12. The method of claim 9, wherein the first etching process includes a first plasma etching power and the second etching process includes a second, different, plasma etching power applied to the substrate.

13. The method of claim 9, wherein applying a first etching process includes applying a gas chemistry having at least one of hydrogen bromide and chlorine.

14. The method of claim 9, wherein applying a second etching process includes applying a gas chemistry having at least one of oxygen, carbon monoxide, and carbon dioxide.

15. The method of claim 9, wherein applying a planarization material to a substrate comprises applying an organic planarization material to a substrate.

* * * * *